United States Patent
Ding et al.

(10) Patent No.: US 9,728,838 B2
(45) Date of Patent: Aug. 8, 2017

(54) ON CHIP ANTENNA WITH OPENING

(71) Applicant: INTERNATIONAL BUSINESS MACHINES CORPORATION, Armonk, NY (US)

(72) Inventors: Hanyi Ding, Colchester, VT (US); Mark D. Jaffe, Selburne, VT (US); Alvin J. Joseph, Williston, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 84 days.

(21) Appl. No.: 14/687,002

(22) Filed: Apr. 15, 2015

(65) Prior Publication Data
US 2016/0308270 A1    Oct. 20, 2016

(51) Int. Cl.
| | |
|---|---|
| H01L 21/76 | (2006.01) |
| H01L 23/52 | (2006.01) |
| H01Q 1/22 | (2006.01) |
| H01L 21/762 | (2006.01) |
| H01Q 9/16 | (2006.01) |

(52) U.S. Cl.
CPC ..... *H01Q 1/2283* (2013.01); *H01L 21/76224* (2013.01); *H01Q 9/16* (2013.01)

(58) Field of Classification Search
CPC . H01L 21/00; H01L 23/3135; H01L 23/5227; H01L 21/76; H01L 21/76224; H01L 23/52; H01L 28/10
See application file for complete search history.

(56) References Cited

U.S. PATENT DOCUMENTS

| | | | |
|---|---|---|---|
| 5,386,215 A | 1/1995 | Brown | |
| 7,911,014 B2 | 3/2011 | Doan | |
| 8,201,746 B2 | 6/2012 | Guo et al. | |
| 8,519,892 B2 | 8/2013 | Ding et al. | |
| 2008/0272977 A1 | 11/2008 | Gaucher et al. | |
| 2009/0085133 A1* | 4/2009 | Doan | G06K 19/07749 257/428 |

(Continued)

FOREIGN PATENT DOCUMENTS

WO    2009093831 A2    7/2009

OTHER PUBLICATIONS

Babakhani et al., "A 77-GHz Phased-Array Transceiver With On-Chip Antennas in Silicon: Receiver and Antennas", IEEE Journal of Solid-State Circuits, vol. 41, No. 12, Dec. 2006, pp. 2795-2806.

(Continued)

*Primary Examiner* — Fazli Erdem
(74) *Attorney, Agent, or Firm* — David Cain; Andrew M. Calderon; Roberts Mlotkowski Safran Cole & Calderon, P.C.

(57) ABSTRACT

Approaches for an on-chip antenna are provided. A method includes forming an antenna in an insulator layer at a front side of a substrate. The method also includes forming a trench in the substrate underneath the antenna. The method further includes forming a fill material in the trench. The substrate is composed of a material having a first dielectric constant. The fill material has a second dielectric constant that is less than the first dielectric constant.

19 Claims, 4 Drawing Sheets

(56) References Cited

U.S. PATENT DOCUMENTS

| | | | |
|---|---|---|---|
| 2010/0033395 A1* | 2/2010 | Ding | H01Q 1/2283 |
| | | | 343/834 |
| 2010/0035370 A1* | 2/2010 | Ding | H01Q 9/28 |
| | | | 438/29 |
| 2010/0193935 A1* | 8/2010 | Lachner | H01L 23/3135 |
| | | | 257/693 |
| 2013/0027073 A1 | 1/2013 | Pagani et al. | |
| 2014/0071021 A1 | 3/2014 | Liu et al. | |
| 2014/0151455 A1 | 6/2014 | Li et al. | |
| 2014/0191905 A1 | 7/2014 | Kamgaing | |
| 2016/0072182 A1* | 3/2016 | Wang | H01L 23/5227 |
| | | | 343/834 |

OTHER PUBLICATIONS

Chuang et al., "A 60 GHz Millimeter-wave CMOS RFIC-on-chip Dipole Antenna", Microwave Journal, vol. 50, No. 1, Jan. 2007, 10 pages.

Cheema et al., "The Last Barrier: On-chip Antennas", Microwave Magazine,IEEE, (vol. 14, Issue 1), Jan.-Feb. 2013, Abstract only, 1 page.

\* cited by examiner

ON CHIP ANTENNA WITH OPENING

FIELD OF THE INVENTION

The invention relates to antenna devices and, more particularly, to on-chip antenna structures and methods of manufacturing on-chip antenna structures.

BACKGROUND

Antennas for devices that employ short range, low power wireless communication can be realized using semiconductor devices. These antennas have traditionally been formed on an assembly substrate and subsequently coupled to an integrated circuit chip. Antennas of this kind are termed off-chip antennas as the antennas are not fabricated directly on the integrated circuit chip. However, as the size of communication devices has been scaled down and the used frequencies have been heading up over the years, there has been an increasing demand for more compact antenna structures. Accordingly, antennas are increasingly being fabricated directly on the integrated circuit chip, i.e., integrated with the microelectronic silicon structure. This type of antenna is termed an on-chip antenna.

A noted disadvantage of the on-chip antenna (also called an integrated antenna on silicon) is poor radiation efficiency. For a common silicon substrate thickness of about 700 μm, the radiation efficiency of an on-chip antenna can be lower than 20% of that of an equivalent antenna modeled in air. This low efficiency is due to the relatively high dielectric constant of silicon and its conductive loss. Even with a thinner silicon substrate thickness, e.g., 100 μm, the radiation efficiency of an on-chip dipole antenna is only about 60% of that of an equivalent antenna modeled in air.

Another related disadvantage of on-chip antennas is a poor peak gain due to the conductive loss and high dielectric constant of the silicon substrate. For example, the peak gain of an on-chip antenna can be at least 40% lower compared to an equivalent antenna modeled in air depending upon the silicon thickness.

One effort to improve the radiation of an on-chip antenna adds additional un-doped silicon to the substrate to form a lens. The silicon lens has a coated dielectric matching layer for impedance transformation between silicon and air to convert a surface wave in the silicon substrate to a radiation wave for improving the radiation efficiency. This method requires plural additional processing steps, which adds to the cost and complexity of manufacture. This method also disadvantageously increases the size of the chip due to the addition of the lens.

SUMMARY

In a first aspect of the invention, there is a method of forming a semiconductor structure. The method includes forming an antenna in an insulator layer at a front side of a substrate. The method also includes forming a trench in the substrate underneath the antenna. The method further includes forming a fill material in the trench. The substrate is composed of a material having a first dielectric constant. The fill material has a second dielectric constant that is less than the first dielectric constant.

In another aspect of the invention, there is a method of forming a semiconductor structure. The method includes forming a plurality of trenches in substrate. The method also includes forming a fill material in the plurality of trenches, wherein the substrate is composed of a material having a first dielectric constant, and the fill material has a second dielectric constant that is less than the first dielectric constant. The method further includes forming an antenna in an insulator layer over the plurality of trenches.

In another aspect of the invention, there is a semiconductor structure that includes: a substrate composed of a first material having a first dielectric constant; at least one circuit device at a front side of the substrate; an on-chip antenna in an insulator layer at the front side of the substrate; and at least one trench in the substrate and underneath the antenna. The at least one trench contains a fill material having a second dielectric constant that is less than the first dielectric constant. A width of the at least one trench is greater than a width of the antenna.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to antenna devices and, more particularly, to on-chip antenna structures and methods of manufacturing on-chip antenna structures. According to aspects of the invention, a portion of a silicon-containing substrate underneath an antenna is removed and replaced with a fill material that has a dielectric constant that is less than the dielectric constant of the material of the substrate. The removal of the silicon in the vicinity of the antenna improves the radiation efficiency and peak radiation power of the antenna, and the refilled material keeps the mechanical strength and then the yield of the devices. In this manner, implementations of the invention provide improvements to on-chip antennas.

The structures of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks after the devices in the semiconductor substrate are built: (i) deposition of thin films of material on a substrate, (ii) applying a patterned mask on top of the films by photolithographic imaging, and (iii) etching the films selectively to the mask.

Figure 1:
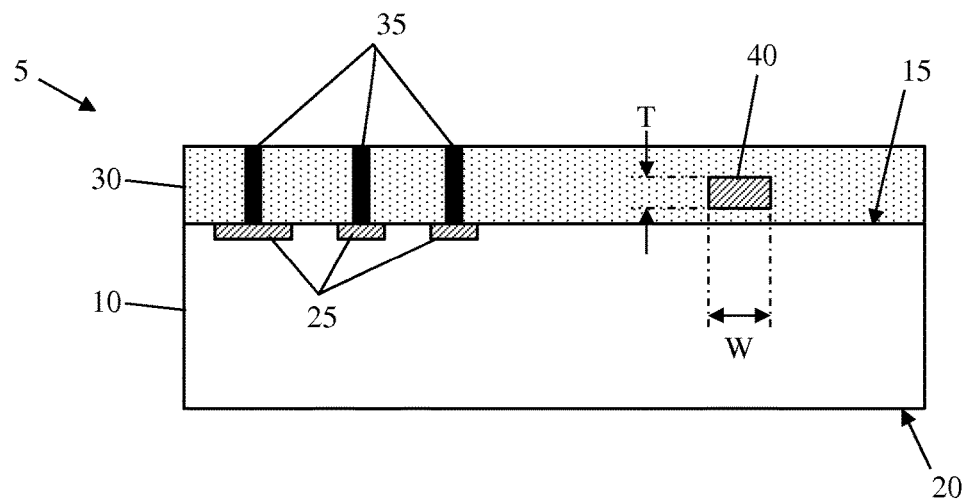
FIGS. 1-6 show structures and respective processing steps in accordance with aspects of the invention.

FIGS. 1-5 show processing steps and respective structures in accordance with aspects of the invention. In particular, FIG. 1 shows a cross section (side view) of a portion of a semiconductor structure 5 that has undergone CMOS or BiCMOS processing. The semiconductor structure 5 may comprise a substrate 10. The substrate 10 may be composed of any suitable material or combination of materials including doped or undoped silicon (e.g., Si, SiGe, SiGeC, SiC, etc.). The substrate 10 may be a bulk material substrate or a silicon-on-insulator (SOI) substrate, both of which are understood in the art. In embodiments, the substrate 10 is a bulk silicon substrate in which the silicon material has a dielectric constant in a range of about 11.7 to 12.9. The substrate 10 may have any suitable thickness in the vertical direction between a front (top) side 15 and a back (bottom) side 20, such as between 50 μm and 700 μm without limiting aspects of the invention.

As shown in FIG. 1, devices 25 are formed in and/or on the substrate 10 at the front side 15. The devices 25 may include any suitable arrangement of integrated circuit devices, including but not limited to transistors (e.g., field effect transistors), capacitors, inductors, resistors, etc. The devices 25 may be formed using conventional semiconductor manufacturing processes and materials.

Still referring to FIG. 1, an insulator layer 30 is formed on the front side 15 of the substrate 10 over the devices 25. The insulator layer 30 may comprise one or more interlevel dielectric (ILD) layers composed of conventional materials such as, for example, $SiO_2$, $Si_3N_4$, SiCOH, silsesquioxanes, borophosphosilicate glass (BPSG), etc., as understood by those of skill in the art. Any number and arrangement of electrically conductive elements 35, such as wires, vias, and/or interconnects, may be formed in the insulator layer 30. The conductive elements 35 and insulator layer 30 may be formed using conventional semiconductor manufacturing processes and materials such as deposition of material, photolithography and etching processes known to those of skill in the art.

With continued reference to FIG. 1, an on-chip antenna 40 is formed in the insulator layer 30 at the front side 15 of the substrate 10. The antenna 40 may be any suitable type of antenna, such as a dipole, slot, or patch antenna. The antenna 40 may comprise any suitable electrically conductive material, such as metal or metal alloy. For example, the antenna 40 may comprise copper or aluminum or alloys thereof. The antenna 40 may have any desired size and shape. For example, the antenna 40 may be a dipole antenna having a width "W" of about 20 μm, a thickness "T" of about 4 μm, and a length (orthogonal to the width and thickness) of 1200 μm or more or less, although the invention is not limited to these dimensions and any suitable dimensions may be used. The antenna 40 may be formed using conventional semiconductor manufacturing processes, such as forming a trench in one or more of the ILD layers of the insulator layer 30 (e.g., using photolithographic masking and etching) and depositing the conductive material of the antenna 40 in the trench (e.g., using chemical vapor deposition (CVD) or other suitable deposition process). The antenna 40 can be also formed using multiple metal layers and vias built in the insulator layer 30.

Figure 2:
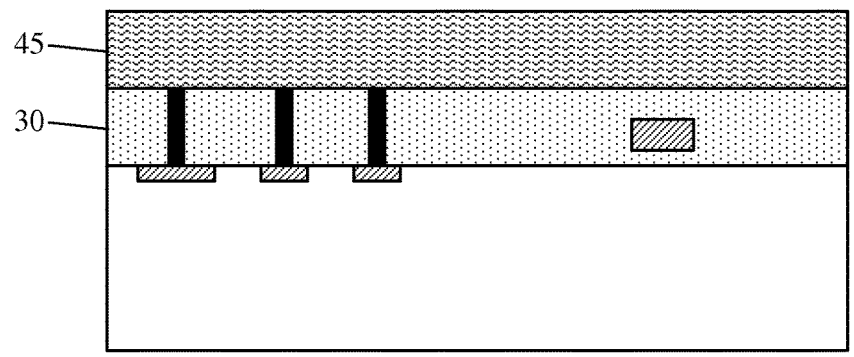

As shown in FIG. 2, a handler wafer 45 is bonded to the uppermost surface of the insulator layer 30. The handler wafer 45 may comprise conventional materials (e.g., glass) and may be bonded to the insulator layer 30 using conventional methods (e.g., releasable adhesive). As is understood in the art, the handler wafer 45 enhances the mechanical integrity of the device wafer (e.g., substrate 10) during subsequent processing of the device wafer. After processing as described herein, the handler wafer 45 is detached from the device wafer by debonding the adhesive using a conventional technique such as thermal release, chemical dissolving, mechanical release, and laser ablation.

Figure 3:
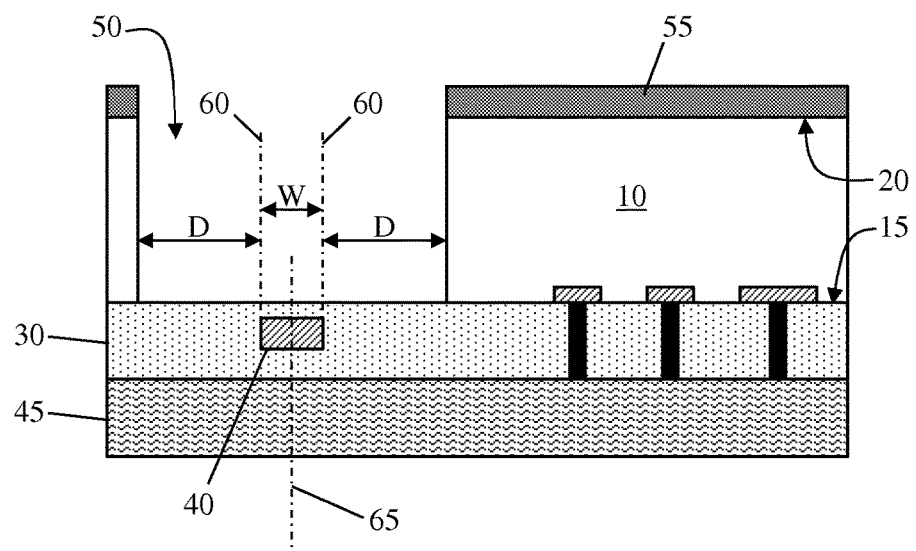

As shown in FIG. 3, a trench 50 is formed in the substrate 10 extending from the backside 20 toward the front side 15 after the wafer is thinned to a needed thickness, for example 100 um. The trench 50 may be formed using through-silicon-via trenching techniques. For example, the structure may be flipped over and supported using the handler wafer 45, and photoresist 55 may be formed on the backside 20 of the substrate 10 and patterned (e.g., exposed and developed) to form a mask. The trench 50 may be formed by etching the substrate 10 through a hole in the patterned photoresist 55. Any suitable etch process and chemistry may be used based on, for example, the material of the substrate 10, the desired etch profile, and the desired etch rate. In embodiments, an anisotropic reactive ion etch (RIE) process is employed to form the trench 50. After forming the trench 50, the photoresist 55 is removed, e.g., using an ashing or stripping process In embodiments, the trench 50 extends completely through the entire thickness of the substrate 10, such that a surface of the insulator layer 30 is exposed at a bottom of the trench 50. However, the invention is not limited to this embodiment, and the trench 50 may be timed to end prior to the insulator layer 30, such that a few μm (e.g., less than 10) of material of the substrate 10 remain between the base of the trench 50 and the insulator layer 30.

According to aspects of the invention, the trench 50 is formed such that it overlaps the antenna 40 in the vertical direction. Stated differently, vertical lines 60 at the lateral edges of the antenna 40 are within the width of the trench 50. In a particular embodiment, the trench 50 and the antenna 40 are aligned along a common line 65 that bisects both structures. Aspects of the invention are not limited to perfect alignment and deviation in alignment is allowed. In embodiments, the width of the trench 50 is at least 10 times greater than the width of the antenna 40. Smaller widths of the trench 50 may be used but may result in limited or no performance improvements. In one example, the width of the antenna is 20 μm and the width of the trench is 320 μm (16 times greater). In another example, a lateral distance "D" between lateral edges of the antenna 40 and lateral edges of the trench 50 is about 5 times the width "W" of the antenna 40 (e.g., D≈5×W). In this manner, a sufficient amount of silicon is removed from the vicinity of the antenna 40 to improve the transmission performance of the antenna 40.

Figure 4:
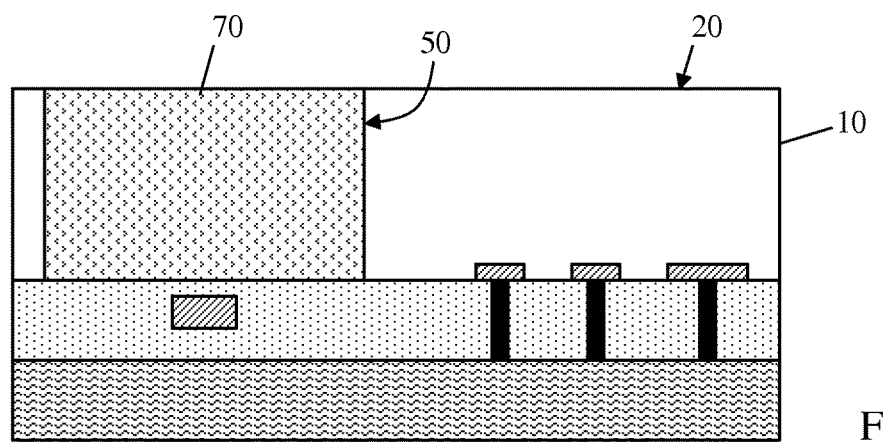

As shown in FIG. 4, the trench 50 is filled with a material 70 (also referred to as a fill material). In embodiments, the material 70 is a dielectric material that has a dielectric constant lower than that of silicon of the substrate 10 (i.e., less than 11.7) and has low loss factor at the antenna operation frequency, with a lower loss factor providing better performance. The material 70 may comprise, for example, $SiO_2$, fluorosilicate glass (FSG), or polyimide, although the invention is not limited to these materials and other suitable low to medium dielectric constant materials may be used. The material 70 may be formed using conventional processes, such as CVD for $SiO_2$. After forming the material 70 in the trench 50, any excess material may be removed from the back side 20 of the substrate 10 using, for example, a chemical mechanical polish (CMP).

Figure 5:
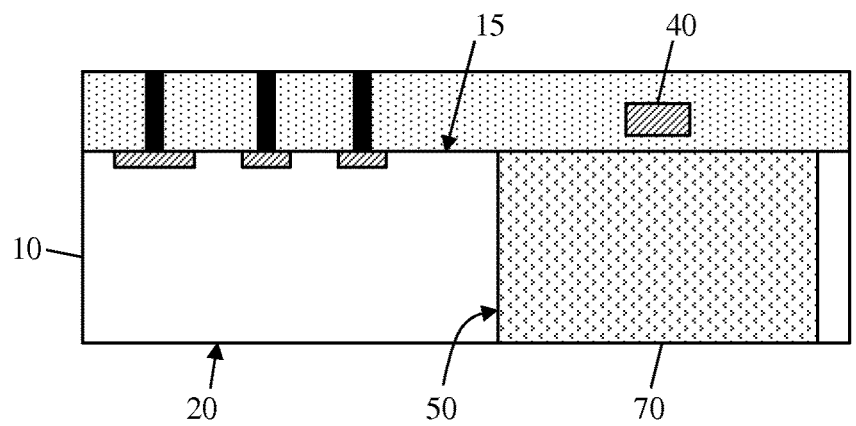

As shown in FIG. 5, the structure may be flipped over and the handler wafer removed after forming the material 70 in the trench 50. The handler wafer 45 may be removed by debonding as described herein.

As depicted in FIGS. 1-5, the trench 50 is formed in the substrate 10 after forming the antenna 40. Moreover, the trench 50 is formed starting at the back side 20 of the substrate 10 and etching toward the front side 15. The material 70 used to fill the trench 50 has a lower dielectric constant and lower loss factor than the silicon of the substrate 10, and thus improves the radiation efficiency and peak power of the antenna 40 compared to the case of a substrate that is not provided with a trench and fill material.

Figure 6:
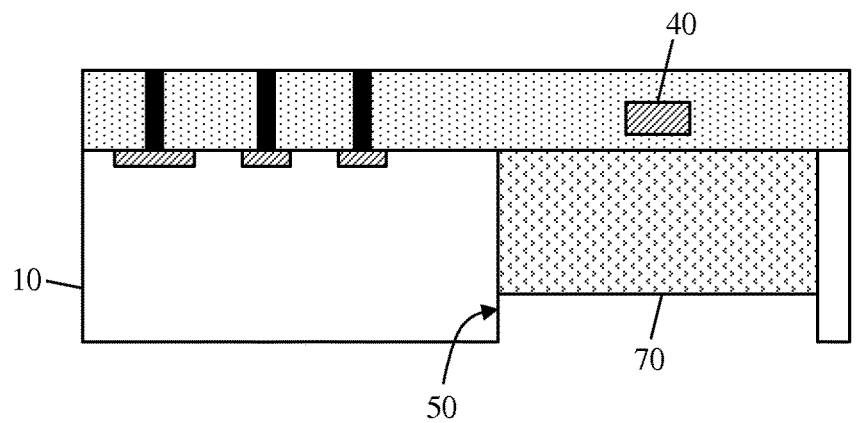

As shown in FIG. 6, the material 70 may be formed such that it only partially (and not completely) fills the trench 50. In this manner, the silicon of the substrate 10 underneath the antenna 40 is replaced with a combination of the material 70 and air. In embodiments, at least half the depth of the trench 50 is filled with the material 70 in order to provide sufficient mechanical strength (structural integrity) to the chip as a whole.

Figure 7:
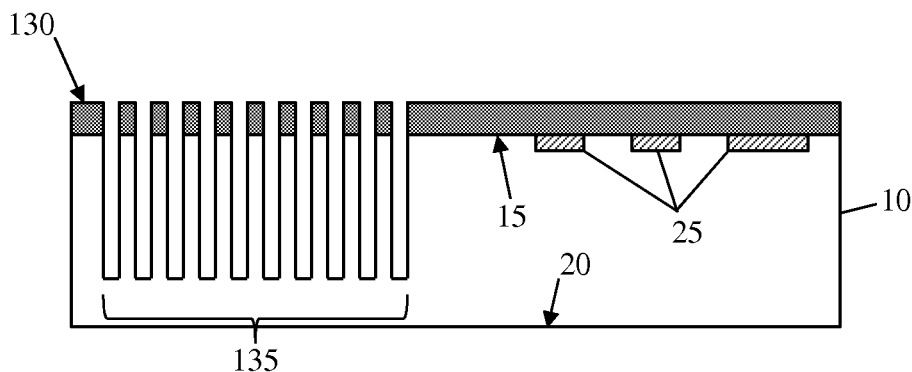
FIGS. 7-12 show structures and respective processing steps in accordance with further aspects of the invention.

FIGS. 7-11 show processing steps and respective structures in accordance with another embodiment of the invention. In particular, FIG. 7 shows a cross section of a portion of a semiconductor structure comprising a substrate 10 having a front side 15, a backside 20 and devices 25, similar to that described with respect to FIG. 1. In this embodiment, a mask 130 is formed on the front side 15 of the substrate 10 and used to form plural trenches 135 in the substrate 10. For example, the mask 130 may be patterned photoresist. The trenches 135 may be formed by etching the substrate 10, e.g., using anisotropic RIE, through holes in the mask 130. The trenches 135 extend partially into the substrate 10 but do not extend completely through the entire vertical thickness of the substrate 10. In embodiments, the trenches extend into the substrate 10 to a depth equal to or greater than a desired final thickness of the substrate 10, which may be about 100 µm for example.

Figure 8:
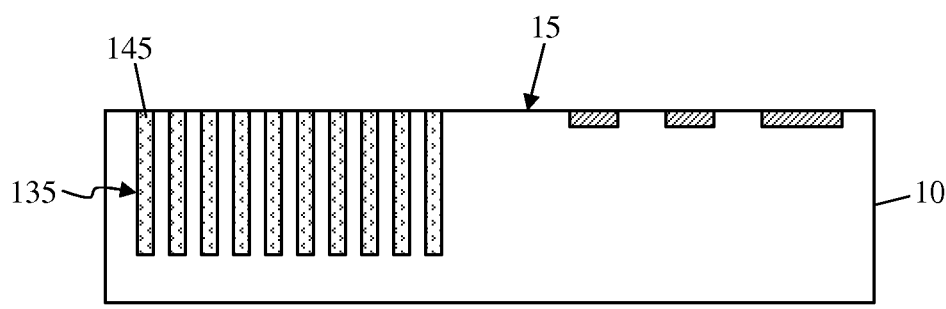

As shown in FIG. 8, the mask is stripped and the trenches 135 are filled with material 145. In embodiments, the material 145 is a dielectric material that has a dielectric constant lower than that of the silicon of the substrate 10 (i.e., less than 11.7) and has low loss factor at the antenna operation frequency. The material 145 may comprise, for example, $SiO_2$, FSG, or polyimide, although the invention is not limited to these materials and other suitable low to medium dielectric constant materials may be used. The material 145 may be formed using conventional processes, such as CVD for $SiO_2$. After forming the material 145 in the trenches 135, any excess material may be removed from the front side 15 of the substrate 10 using CMP, for example.

Figure 9:
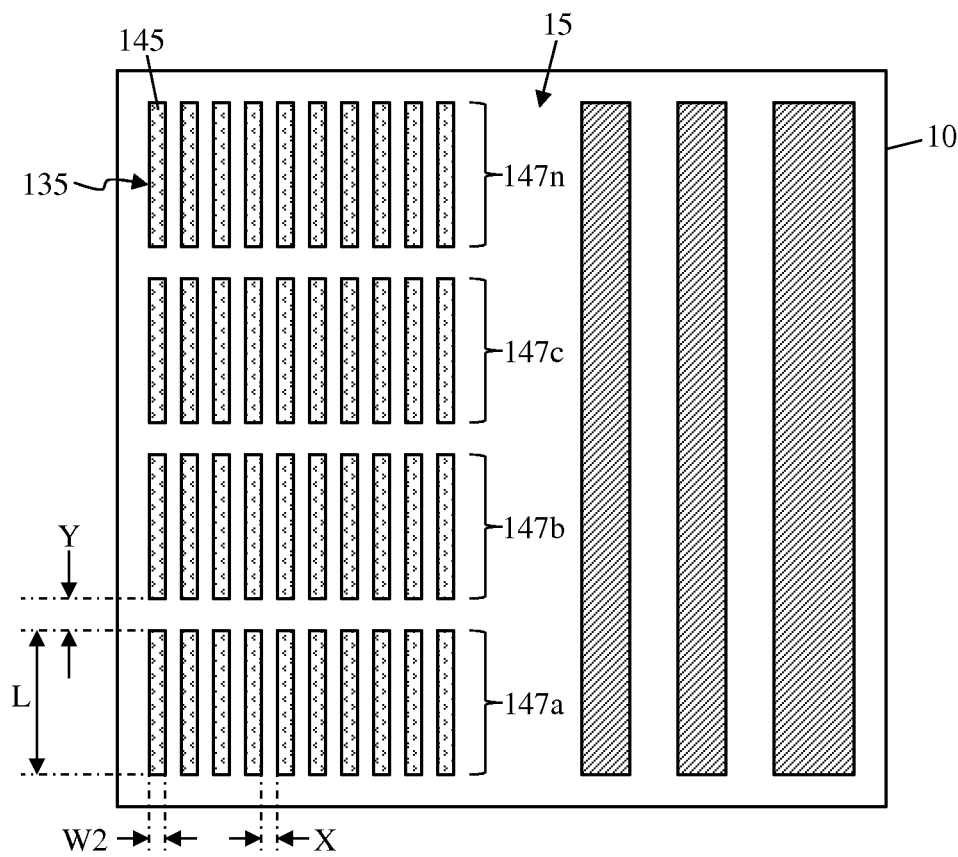

FIG. 9 is a top view of the structure of FIG. 8 and shows the front side 15 of the substrate 10 with the trenches 135 filled with the material 145. As shown in FIG. 9, the trenches 135 are arranged in groups 147a, 147b, 147c, . . . , 147n, where "n" is any desired number of groups along a length dimension of the chip. Each trench 135 has a length L and a width W2 that may be any desired value. In a non-limiting example, the length L is about 20 to 21 µm and the width W2 is about 3 to 5 µm. Adjacent trenches 135 in each group are spaced apart by an amount X, which may be any desired value and in embodiments is about 5 to 6 µm. Adjacent groups (e.g., 147a and 147b) are spaced apart by an amount Y, which may be any desired value and in embodiments is about 5 to 6 µm. Aspects of the invention are not limited to the shape and pattern of trenches 135 shown in FIG. 9; instead, any shape and/or pattern may be used, including a non-intersecting brick layer pattern or an intersecting honeycomb pattern.

Figure 10:
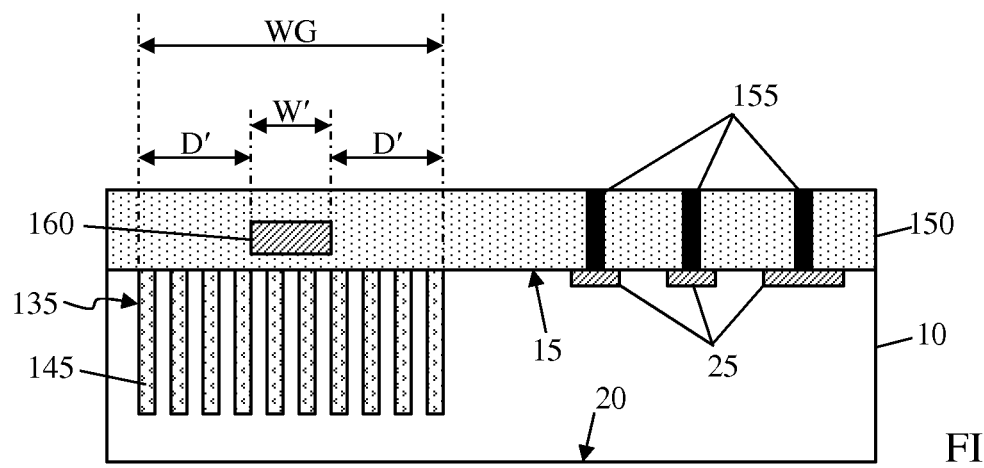

As shown in FIG. 10, an insulator layer 150 is formed on the front side 15 of the substrate 10 over the devices 25 and over the material 145. The insulator layer 150 may be similar to the insulator layer 30 described herein, e.g., may comprise one or more ILD layers formed using conventional material and processes. Conductive elements 155 and an antenna 160 are formed in the insulator layer 150, e.g., in a manner similar to that described with respect to FIG. 1. The antenna 160 may comprise a dipole antenna, as but one example.

According to aspects of the invention, the trenches 135 and antenna 160 are formed with sizes and locations such that the width WG of a group (e.g., 147a) is greater than the width W' of the antenna 160. In embodiments, the group width WG is at least 10 times greater than the antenna width W'. Smaller widths of the trench 50 may be used but may result in limited or no performance improvements. In one example, the antenna width W' is 20 µm and the group width WG is 320 µm (16 times greater). In another example, a lateral distance D' between lateral edges of the antenna 160 and lateral edges of the group (e.g., 147a) is about 5 times the antenna width W' (e.g., D'≈5×W'). In this manner, a sufficient amount of silicon is removed from near the antenna 160 to improve the transmission performance of the antenna 160.

Figure 11:
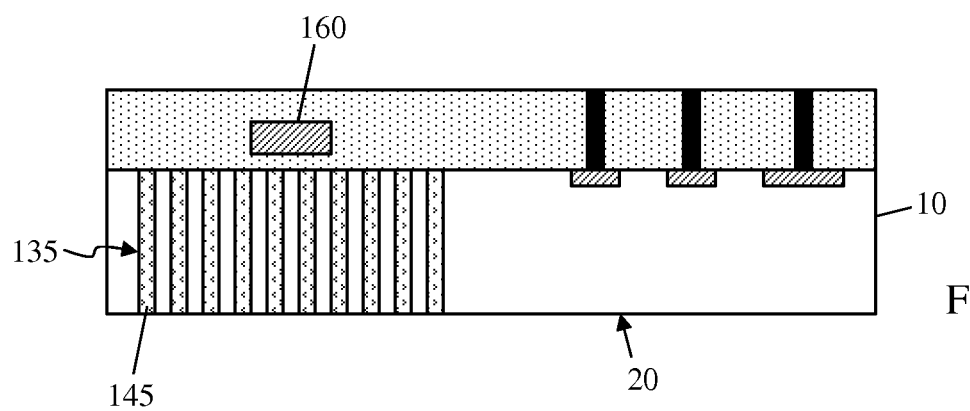

As shown in FIG. 11, the substrate 10 is thinned by grinding the back side 20 of the substrate 10. In embodiments, the grinding removes material of the substrate 10 until the material 145 in the trenches 135 is exposed at the back side 20.

As depicted in FIGS. 7-11, the trenches 135 are formed in the substrate 10 prior to forming the antenna 160. Moreover, the trenches 135 are formed starting at the front side 15 of the substrate 10 and etching toward the back side 20. The material 145 has a lower dielectric constant and loss factor than the silicon of the substrate 10, and thus improves the radiation efficiency and peak power of the antenna 160 compared to the case of a substrate that is not provided with a trench and fill material.

Figure 12:
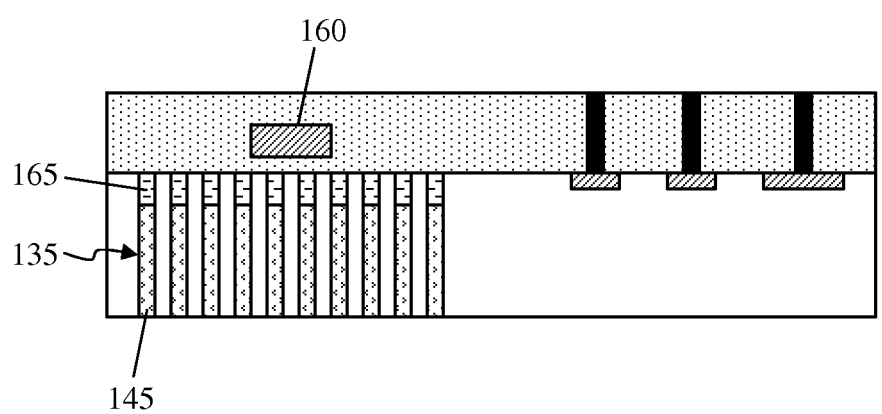

As shown in FIG. 12, the material 145 may be formed such that it only partially (and not completely) fills the trenches 135. In this manner, the silicon underneath the antenna is replaced with a combination of the material 145 and air 165. In embodiments, at least half the depth of each trench 135 is filled with the material 145 in order to provide sufficient mechanical strength (structural integrity) to the chip as a whole.

Table 1 shows a comparison of simulations data for different antenna configurations. Row 1 corresponds to a dipole antenna modeled in air without a reflector (e.g., a theoretical ideal antenna). Row 2 corresponds to a dipole antenna having similar dimensions to that of the antenna of Row 1, and that is formed in $SiO_2$ over a 100 µm thick Si substrate (e.g., as shown in FIG. 1). Row 3 corresponds to a dipole antenna having similar dimensions to that of the antenna of Row 1, and that is formed in $SiO_2$ over a 100 µm thick Si substrate, and with an opening in the substrate filled with $SiO_2$ (e.g., as shown in FIG. 6). The radiation efficiency and peak gain of the structure of Row 3 is significantly better than that of the structure of Row 2 because aspects of the invention replace a portion of the high dielectric constant (and lossy) silicon substrate with a material having a lower dielectric constant.

TABLE 1

|   | Antenna Configuration | Radiation Efficiency | Peak Gain |
|---|---|---|---|
| 1 | Dipole in Air, no reflector | 0.99837 | 1.6882 |
| 2 | Dipole in $SiO_2$ and Si, no reflector | 0.57559 | 1.0435 |
| 3 | Dipole in $SiO_2$ and Si with opening, no reflector | 0.89412 | 1.7761 |
| 4 | Dipole in Air, with reflector | 0.99487 | 5.4298 |
| 5 | Dipole in $SiO_2$ and Si, with reflector at BEOL side | 0.60176 | 3.4461 |

TABLE 1-continued

| | Antenna Configuration | Radiation Efficiency | Peak Gain |
|---|---|---|---|
| 6 | Dipole in SiO$_2$ and Si, with reflector at silicon side | 0.61279 | 3.3581 |
| 7 | Dipole in SiO$_2$ and Si with opening, with reflector at BEOL side | 0.88912 | 5.2977 |
| 8 | Dipole in SiO$_2$ and Si with opening, with reflector at silicon side | 0.89442 | 5.2055 |

Still referring to Table 1, Rows 4-8 correspond to cases that employ an off-chip reflector in the simulation. Specifically, Row 4 corresponds to a dipole antenna modeled in air with a reflector (e.g., a theoretical ideal antenna). Row 5 corresponds to a dipole antenna having similar dimensions to that of the antenna of Row 4, and that is formed in SiO$_2$ over a 100 μm thick Si substrate and with a reflector at the BEOL (back end of line) side. Row 6 corresponds to a dipole antenna having similar dimensions to that of the antenna of Row 4, and that is formed in SiO$_2$ over a 100 μm thick Si substrate and with a reflector at the silicon side. Row 7 corresponds to a dipole antenna having similar dimensions to that of the antenna of Row 4, and that is formed in SiO$_2$ over a 100 μm thick Si substrate and with a reflector at the BEOL side, and that has an opening in the substrate filled with SiO$_2$ (e.g., as shown in FIG. 6). Row 8 corresponds to a dipole antenna having similar dimensions to that of the antenna of Row 4, and that is formed in SiO$_2$ over a 100 μm thick Si substrate and with a reflector at the silicon side, and with an opening in the substrate filled with SiO$_2$ (e.g., as shown in FIG. 6). The radiation efficiency and peak gain of the structures of Rows 7 and 8 is significantly better than that of the structures of Rows 5 and 6 because aspects of the invention replace a portion of the high dielectric constant (and lossy) silicon substrate with a material having a lower dielectric constant.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming an antenna in an insulator layer at a front side of a substrate;
    forming a trench in the substrate underneath the antenna so that the antenna is completely over the trench and are aligned with respect to each other so that a common line extends through and bisects both the antenna and the trench; and
    forming a fill material in the trench,
    wherein the substrate is composed of a material having a first dielectric constant; and
    the fill material has a second dielectric constant that is less than the first dielectric constant.

2. The method of claim 1, wherein the forming the trench comprises forming the trench through an entire thickness of the substrate.

3. The method of claim 1, wherein the forming the fill material in the trench comprises filling an entirety of the trench with the fill material.

4. The method of claim 1, wherein the forming the fill material in the trench comprises filling less than an entirety of the trench with the fill material, such that the trench contains a combination of the fill material and air.

5. The method of claim 1, wherein a width of the trench is greater than a width of the antenna.

6. The method of claim 5, wherein the width of the trench is at least ten times greater than the width of the antenna.

7. The method of claim 1, wherein the forming the antenna is performed prior to the forming the trench, and further comprising forming at least one circuit device at the front side of the substrate before the forming the trench.

8. The method of claim 1, wherein the forming the trench comprises etching the substrate from a back side of the substrate toward the front side of the substrate.

9. A method of forming a semiconductor structure, comprising:
    forming a plurality of trenches in a substrate;
    forming a fill material in the plurality of trenches, wherein the substrate is composed of a material having a first dielectric constant, and the fill material has a second dielectric constant that is less than the first dielectric constant; and
    forming an antenna in an insulator layer completely over the plurality of trenches so that a width of a group of the plurality of trenches is at least 10 times greater than a width of the antenna.

10. The method of claim 9, wherein the forming the plurality of trenches comprises forming the plurality of trenches at a front side of the substrate and through less than an entire thickness of the substrate.

11. The method of claim 10, further comprising thinning the substrate to expose the fill material in the plurality of trenches at a back side of the substrate.

12. The method of claim 9, wherein the forming the fill material in the plurality of trenches comprises filling an entirety of each of the plurality of trenches with the fill material.

13. The method of claim 9, wherein the forming the fill material in the plurality of trenches comprises filling less than an entirety of each of the plurality of trenches with the fill material, such that each of the plurality of trenches contains a combination of the fill material and air.

14. The method of claim 9, wherein the forming the antenna is performed after the forming the plurality of trenches, and further comprising forming at least one circuit device at the front side of the substrate before the forming the antenna.

15. The method of claim 9, wherein the forming the plurality of trenches comprises etching the substrate from the front side of the substrate toward a back side of the substrate.

16. A semiconductor structure, comprising:
a substrate composed of a first material having a first dielectric constant;
at least one circuit device at a front side of the substrate;
an on-chip antenna in an insulator layer at the front side of the substrate; and
at least one trench in the substrate and underneath the antenna so that the antenna is completely over the at least one trench and the antenna and the at least one trench are aligned with respect to each other so that a common line extends through and bisects both the antenna and the at least one trench,
wherein the at least one trench contains a fill material having a second dielectric constant that is less than the first dielectric constant; and
a width of the at least one trench is greater than a width of the antenna.

17. The structure of claim 16, wherein the at least one trench comprises a single trench that extends from the front side of the substrate to a back side of the substrate, and the single trench has a width that is greater than the width of the antenna.

18. The structure of claim 17, wherein the at least one trench comprises a plurality of trenches spaced apart from one another and extending from the front side of the substrate to a back side of the substrate so that the antenna is completely within a width formed by the plurality of trenches, and wherein a group of the plurality of trenches has a width that is greater than the width of the antenna.

19. The structure of claim 16, wherein the fill material fills less than an entirety of the at least one trench, such that the at least one trench contains a combination of the fill material and air.

* * * * *